United States Patent [19]

Jaskolski et al.

[11] Patent Number: 5,274,332
[45] Date of Patent: Dec. 28, 1993

[54] INDUCTIVELY COUPLED MULTI-SECTION RADIO FREQUENCY FIELD COIL FOR NMR

[75] Inventors: Patrick L. Jaskolski, Wauwatosa; Thomas J. Sierocuk, New Berlin, both of Wis.

[73] Assignee: General Electric Company, Milwaukee, Wis.

[21] Appl. No.: 551,626

[22] Filed: Nov. 14, 1983

[51] Int. Cl.⁵ .............................................. G01R 33/20
[52] U.S. Cl. ..................................... 324/318; 324/322
[58] Field of Search ............... 324/300, 308, 314, 318, 324/322, 319, 320, 322; 128/653, 691, 692, 721

[56] References Cited

U.S. PATENT DOCUMENTS

| | | | |
|---|---|---|---|
| 2,964,696 | 12/1960 | Pinkley | 324/322 |
| 3,427,532 | 2/1969 | Nelson | 324/308 |
| 3,945,250 | 3/1976 | Elazar | 128/691 |
| 4,398,149 | 8/1983 | Zens | 324/319 |

*Primary Examiner*—Michael J. Tokar
*Attorney, Agent, or Firm*—James O. Skarsten

[57] ABSTRACT

An NMR radio-frequency (RF) coil is made up, in the preferred embodiment, of upper and lower coil assemblies. Each coil assembly includes a tuned circuit. In operation, only one of the tuned circuits is energized, while the other is mutually inductively coupled such that they resonate together as one circuit at substantially the same frequency. A first set of latches is provided to fasten the lower coil assembly to a patient cradle. A second set of latches is utilized to fasten the upper coil assembly to the lower while permitting relative longitudinal motion between the two assemblies.

In another embodiment, which does not utilize mutual inductance, the tuned circuits on each assembly are electrically connected to form a complete coil by means of, for example, an electrical plug-and-jack arrangement.

29 Claims, 2 Drawing Sheets

INDUCTIVELY COUPLED MULTI-SECTION RADIO FREQUENCY FIELD COIL FOR NMR

BACKGROUND OF THE INVENTION

This invention relates to nuclear magnetic resonance (NMR) apparatus. More specifically, this invention relates to inductively coupled multi-section radio frequency (RF) coils useful with such apparatus for transmitting and/or receiving RF signals.

In the past, the NMR phenomenon has been utilized by structural chemists to study, in vitro, the molecular structure of organic molecules. Typically, NMR spectrometers utilized for this purpose were designed to accommodate relatively small samples of the substance to be studied. More recently, however, NMR has been developed into an imaging modality utilized to obtain images of anatomical features of live human subjects, for example. Such images depicting parameters associated with nuclear spins (typically hydrogen protons associated with water in tissue) may be of medical diagnostic value in determining the state of health of tissue in the region examined. NMR techniques have also been extended to in vivo spectroscopy of such elements as phosphorus and carbon, for example, providing researchers with the tools, for the first time, to study chemical processes in a living organism. The use of NMR to produce images and spectroscopic studies of the human body has necessitated the use of specifically designed system components, such as the magnet, gradient and RF coils.

By way of background, the nuclear magnetic resonance phenomenon occurs in atomic nuclei having an odd number of protons and/or neutrons. Due to the spin of the protons and neutrons, each such nucleus exhibits a magnetic moment, such that, when a sample composed of such nuclei is placed in a static, homogeneous magnetic field, $B_0$, a greater number of nuclear magnetic moments align with the field to produce a net macroscopic magnetization M in the direction of the field. Under the influence of the magnetic field $B_0$, also referred to as the polarizing field, the magnetic moments precess about the axis of the field at a frequency which is dependent on the strenth of the applied magnetic field and on the characteristics of the nuclei. The angular precession frequency, $\omega$, also referred to as the Larmor frequency, is given by the equation $\omega = \gamma B$, in which $\gamma$ is the gyromagnetic ratio (which is constant for each NMR isotope) and wherein B is the magnetic field ($B_0$ plus other fields) acting upon the nuclear spin. It will be thus apparent that the resonant frequency is dependent on the strength of the magnetic field in which the sample is positioned.

The orientation of magnetization M, normally directed along the magnetic field $B_0$, may be perturbed by the application of magnetic fields oscillating at or near the Larmor frequency. Typically, such magnetic fields designated $B_1$ are applied orthogonal to the direction of magnetization M by means of radio-frequency pulses through a coil connected to radio-frequency-transmitting apparatus. Magnetization M rotates about the direction of the $B_1$ field. In NMR, it is typically desired to apply RF pulses of sufficient magnitude and duration to rotate magnetization M into a plane perpendicular to the direction of the $B_0$ field. This plane is commonly referred to as the transverse plane. Upon cessation of the RF excitation, the nuclear moments rotated into the transverse plane begin to realign with the $B_0$ field by a variety of physical processes. During this realignment process, the nuclear moments emit radio-frequency signals, termed the NMR signals, which are characteristic of the magnetic field and of the particular chemical environment in which the nuclei are situated. The same or a second RF coil may be used to receive the signals emitted from the nuclei. In NMR imaging applications, the NMR signals are observed in the presence of magnetic-field gradients which are utilized to encode spatial information into the NMR signal. This information is later used to reconstruct images of the object studied in a manner well known to those skilled in the art.

The use of a solenoidal geometry has been found advantageous in the design of magnets used to produce the $B_0$ magnetic field. The use of this geometry, however, imposes two constraints on the design of RF coils. One of these constraints it that the radio-frequency field $B_1$ produced by the RF coil must be perpendicular to the solenoidal axis of symmetry which is parallel to the axis of field $B_0$. The other constraint is that the RF coil should be constructed on the surface of a cylinder to provide free access along the solenoidal axis to accommodate the patient to be examined. Conventional RF coils are typically constructed on a cylindrical form which has the resonant circuit mounted on the outside surface.

In practice, the use of a cylindrical RF coil geometry requires that the patient be positioned in the active coil region. One way in which this may be achieved is to position a patient on a cradle transport mechanism and to then transport the patient longitudinally into the coil which would be mounted concentrically in the bore of the magnet. Another way in which this may be accomplished, as in the case of NMR head studies, is to place the coil around the head and then position both in the $B_0$ magnetic field. There are a number of disadvantages associated with the conventional coil design. For example, in the case of head studies, the single-piece cylindrical construction limits the operator's view of the patient. This may make it difficult for the operator to monitor the condition of the patient. Such construction may also make it more difficult to position the patient within the coil to obtain optimum results. In some cases, it is desirable to obtain both head and body images utilizing separate RF coils for each. To minimize the data-collection time, it is expeditious to leave the head coil in place while only the body coil is energized. This, however, creates a problem in that there is undesired coupling between the two coils which could affect image quality. It is, therefore, a principal object of the present invention to provide an improved NMR RF coil construction which overcomes the aforementioned disadvantages.

SUMMARY OF THE INVENTION

In accordance with the present invention, there is provided an NMR apparatus having means for producing a polarizing magnetic field and means for positioning the polarized field at least a portion of an object to be examined. An RF coil means made up of two separable assemblies is each supporting a separate coil circuit and being joinable in operation to form an aperture therebetween to receive the portion of the object to be examined. The coil circuits are coupled when the coil assemblies are joined and are capable of functioning as a single resonant circuit at substantially the same resonant frequency when at least one of the coil circuits is energized.

BRIEF DESCRIPTION OF THE DRAWINGS

The features of the invention believed to be novel are set forth with particularity in the appended claims. The invention itself, however, both as to its organization and method of operation, together with further objects and advantages thereof, may best be understood by reference to the following description taken in conjunction with the accompanying drawings in which:

FIG. 2c illustrates in circuit schematic form the coil of FIG. 2a;

DETAILED DESCRIPTION OF THE INVENTION

Figure 1A:
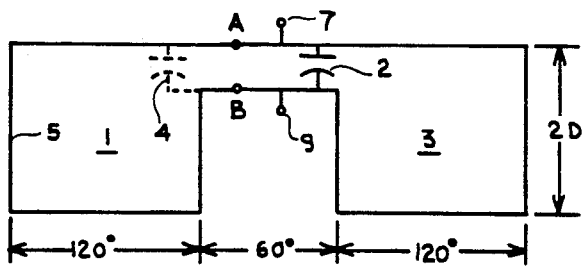
FIG. 1a illustrates a conventional parallel-connected, two-turn NMR RF coil used for whole-body studies.
Figure 1B:
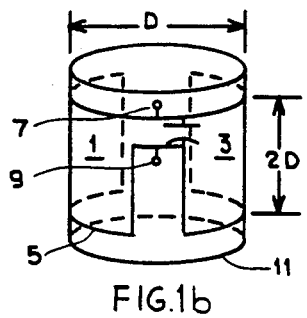
FIG. 1b depicts the coil illustrated in FIG. 1a mounted on a cylindrical form.

Referring first to FIGS. 1a and 1b there will be described a conventional NMR RF coil configuration which is useful in modified form with the present invention, as will be disclosed hereinafter. The coil is made up of single turns 1 and 3 connected in parallel and driven at points 7 and 9 across a tuning capacitor. 2. The capacitor is shown as being of fixed value but may be variable if adjustment is desired. Such a coil is typically formed from copper tubing 5 which is mounted on a non-conductive (high dielectric) cylindrical form 11, as seen in FIG. 1b. Each of the coil turns is sized to cover 120° of the cylinder's circumference. The coil region where connections 7 and 9 are made is sized to cover approximately 60° of circumference. For maximum RF field uniformity, the side of the coil parallel to the longitudinal axis of the cylinder should be equal to two cylinder diameters (D). However, a coil having a side length of two diameters is impractical, because RF energy is placed in the regions of a patient which are not of interest. Therefore, in practice, the coil side length is reduced to approximately one cylinder diameter.

Figure 2A:
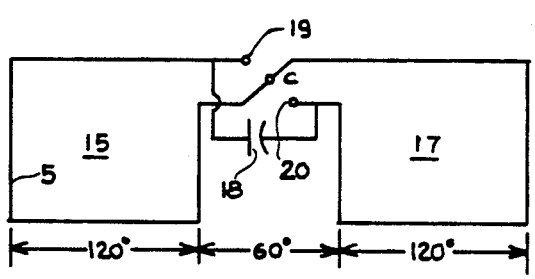
FIG. 2a depicts another conventional two-turn, series-connected NMR RF coil used in NMR studies of the head, for example.
Figure 2B:
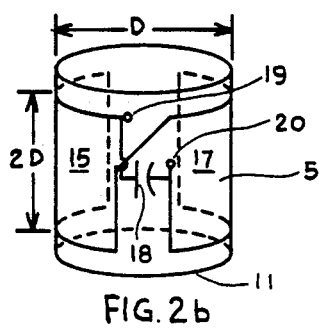
FIG. 2b illustrates the coil depicted in FIG. 2a mounted on a cylindrical form.

Another embodiment of a conventional RF coil which is similar to that depicted in FIG. 1a will now be described with reference to FIGS. 2a and 2b. In this configuration, coil turns 15 and 17 are connected in series and the coil is driven at points 19 and 20 across a tuning capacitor 18. As before, tuning capacitor 18 may be variable if adjustment of the resonant frequency is desired. The coil illustrated in FIGS. 2a and 2b is typically utilized in NMR studies of the head.

A preferred embodiment of an NMR RF coil for use with the invention will now be described with reference to FIG. 3a. The coil is comprised of a plurality of electrically conductive segments 30 connected at evenly spaced points (in the preferred embodiment) around upper and lower electrically conductive loops 31 and 32. Each of the segments includes at least one capacitive element 35. The coil may be driven by a current source (not shown) connected between terminals 34 and 36 across one of the capacitive elements 35. The homogeneity of the $B_1$ field produced by the RF coil increases as the number of conductive segments is increased. This is due to the fact that as the number of segments is increased, the resultant field to produced by many contributions so that the effect of any one conductive segment is reduced. The number of segments cannot be increased without limit, however, since open spaces between adjacent segments are needed to allow a path for the magnetic flux, due to current flow, to escape. Coils having 4, 8, 16, and 32 segments have been constructed. The operation and construction of the coil is disclosed and claimed in copending U.S. patent application Ser. No. 548,745, filed by Cecil Hayes and which is assigned to the same assignee as the present invention, and which is incorporated herein by reference as background material.

Figure 4:
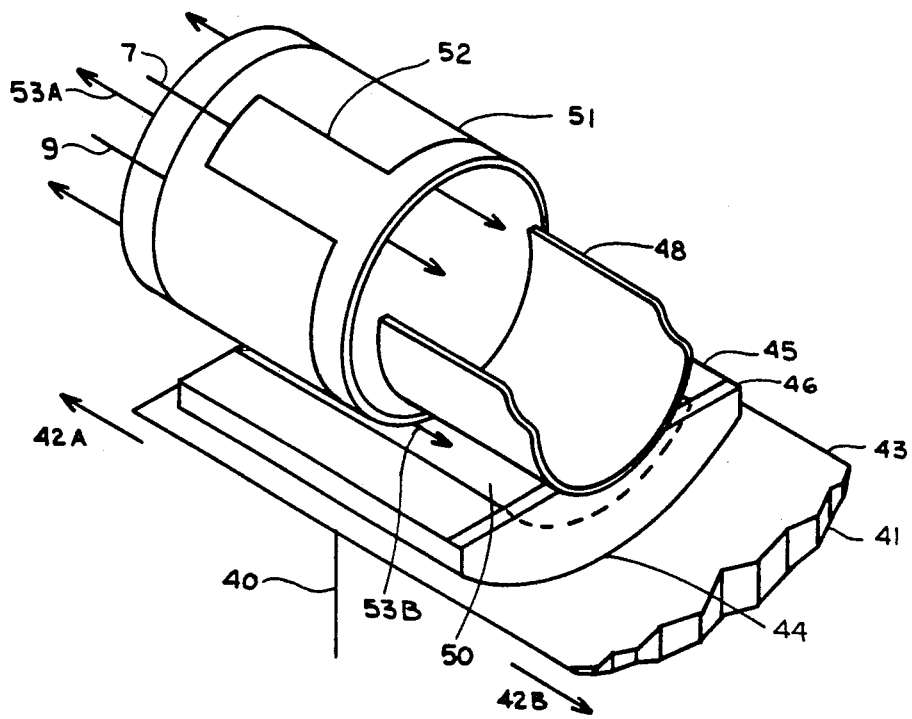
FIG. 4 depicts a conventional patient support including a headholder and an RF coil constructed on a cylindrical form.

The manner is which the RF coil is utilized to obtain, for example, NMR studies of the head in conjunction with the patient transport system will now be described with reference to FIG. 4. FIG. 4 illustrates the use of a patient transfer apparatus in conjunction with a conventional NMR RF coil design with respect to which the advantages of the present invention may be best appreciated. A patient transfer apparatus generally designated 40 includes the patient support cradle 41 adapted for longitudinal travel in opposite direction as indicated by arrows 42A and 42B. The cradle is configured to have a concave upper surface 43 so as to accommodate the complementarily shaped lower convex surface 44 of a headholder support 45. The headholder support is provided at one of the ends thereof with a transverse member 46 for supporting in cantilever fashion a generally U-shaped headholder 48. The headholder extends over the headholder support and is attached to the transverse member along a region 49 in cantilevered fashion so as to provide a space 50 between the lower surface of the headholder and the upper surface of the headholder support. In this manner, a cylindrical form 51 supporting thereon a coil (e.g., the coil described hereinbefore with reference to FIGS. 1a and 1b) is free to move longitudinally in the directions indicated by arrows 53A and 53B so as to encircle, in operator, headholder 48. To collect NMR data, cradle 41, headholder, and coil having a patient placed therein, are then positioned in the main magnetic field, as will be described hereinafter with reference to FIG. 7.

Some of the disadvantages associated with the conventional coil design and support system have been discussed hereinbefore. An additional disadvantage to be noted is that it is difficult to achieve a sufficiently strong bond in region 49 (FIG. 4) to support a substantial portion of the patient's weight in the event that the patient assumes a position in which the weight is distributed, for example, between the feet and the head. Typically, it is desired to have headholder 48 capable of supporting a weight of approximately 300 lbs. The difficulty arises in part from the fact that the non-NMR-active materials utilized in the construction of the headholder and the support are selected from various kinds of engineering plastic materials which must be bonded without the aid of any metallic fasteners, so as to avoid interference with the NMR examination process. Another disadvantage arises from the fact that cylinder 51 supporting the RF coil has a tendency to move and to disturb the desired relationship due to forces generated when the current-carrying conductors in the coil are subjected to pulsed magnetic-field gradients as is the case in NMR examinations.

Figure 1C:
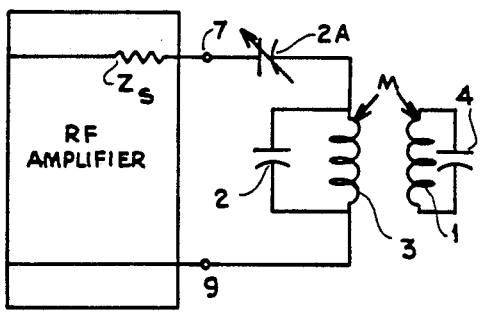
FIG. 1c depicts in circuit schematic form the RF coil of FIG. 1a separated into two coil circuits in accordance with the invention.

In accordance with the invention, the aforedescribed disadvantages are overcome by utilizing an RF coil made up of two separable coil circuits which in operation function as a single RF coil. Each of the coil circuits functions as a separate tuning circuit such that when the two are placed sufficiently close (in one embodiment) there is sufficient mutual inductance for the coil circuits to resonate jointly as a single resonant circuit at substantially the same frequency when energized. Thus for example, the two-turn coil depicted in FIG. 1a can be separated into two tuned circuits by creating open circuits at points A and B. The resulting two tuned circuits are illustrated by means of a circuit schematic in FIG. 1c. The first tuned circuit is made up of the inductance associated with coil turn 1 and a capacitance 4 which is connected in parallel therewith. Similarly, the second tuned circuit is comprised of the inductance associated with coil turn 3 and a parallel-connected capacitance 2. In operation, an RF amplifier is used to energize one of the tuned circuits while the other tuned circuit is coupled strictly through mutual inductance M. In practice, it may be necessary to include a variable capacitor 2A in series with the tuned circuit to provide the means for matching the tuned circuit input impedance to the output impedance $Z_s$ of the RF amplifier. In general, the capacitance values for capacitors 2 and 4 for the two circuits illustrated in FIG. 1c are selected to be approximately one half of the capacitance value needed to resonate the two-turn, parallel-connected coil described with reference to FIG. 1a.

Figure 3A:
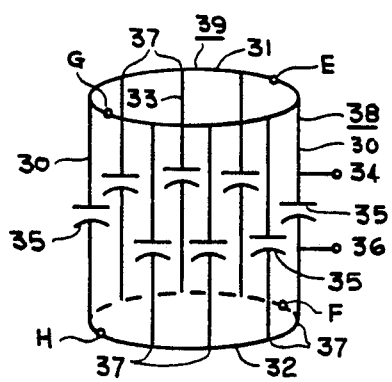
FIG. 3a illustrates as yet another RF coil useful with the invention.
Figure 3B:
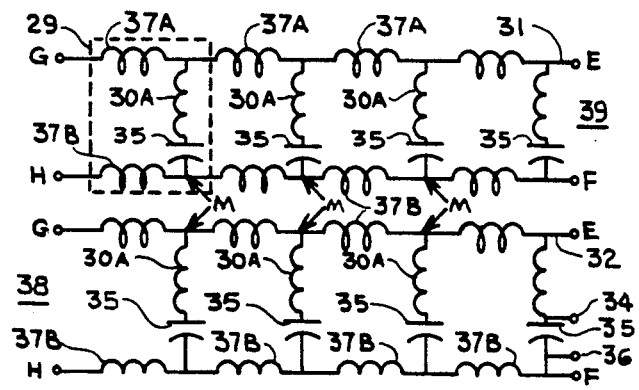
FIG. 3b illustrates in circuit schematic form the coil depicted in FIG. 3a and which has been separated into two coil circuits.

In a similar fashion, the preferred embodiment of the RF coil contemplated for use with the present invention depicted in FIG. 3a may also be separated into two separate tuned circuits. This may be accomplished by creating open circuits at points E and G in the upper conductive loop 31 and at points F and H in the lower conductive loop 32 to form two separate coil circuits generally designated 38 and 39. The two coil circuits are depicted in FIG. 3b in circuit schematic form. Each of coil portions 38 and 39 is made up of a repeat circuit unit, one example of which is enclosed by the dash-line block 29 shown in FIG. 3b. The circuit unit generally comprises two inductive elements 37A and 37B having connected at one of the ends thereof a series-connected combination of inductive element 30A and capacitor 35. Inductive elements 37A are representative of the inductance associated with upper and lower loop portions 37 (FIG. 3a) between adjacent conductive segments 30. Inductive elements 30A are similarly representative of inductance associated with the conductor portions on either side of capacitor 35 in each of conductive segments 30. The coil may be energized by connecting an RF amplifier (not shown) to terminals 34 and 36 in coil circuit 38. In this embodiment, impedance matching between the coil and the RF amplifier may be achieved by subdividing capacitance 35 in a segment to which leads 34 and 36 are connected into a plurality of series-connected capacitive elements, the capacitive values of which collectively equal the capacitance value of a single capacitor 35. Impedance matching may then be achieved by connecting the RF amplifier across one or more of a series-connected capacitive elements.

Figure 5:
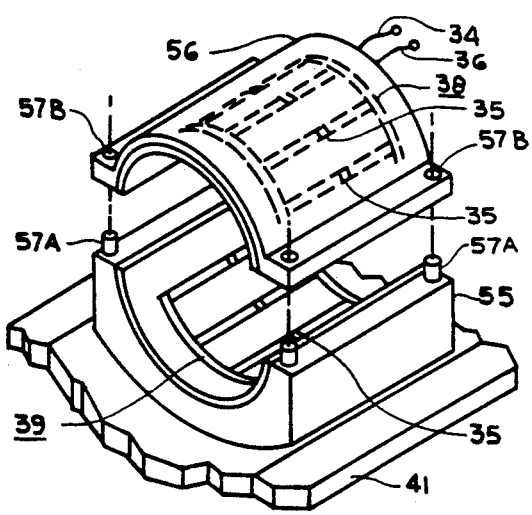
FIG. 5 depicts a two-piece NMR RF coil constructed in accordance with the invention.

The manner in which the invention may be implemented in practice for head or body studies is illustrated in FIG. 5. It will be appreciated that other coil designs may be utilized with the invention, although the embodiment depicted in FIG. 5 is implemented with the RF coil shown in FIGS. 3a and 3b. Continuing with reference to FIG. 5, there is shown a patient support cradle 41. A lower coil support assembly 55 comprises one half of a longitudinally cut cylinder having installed therein one of the coil circuits 39 of the coil illustrated in FIG. 3a and rests on the complementarily shaped upper surface of cradle 41. The upper coil support assembly comprises the other half of the cylinder which has installed therein the second coil circuit 38.

In use, upper coil assembly 56 is removed while the patient is being positioned in the lower assembly. Proper alignment between the upper and lower coil assemblies is achieved by means of alignment pins 57A provided in the lower coil assembly which engage openings 57B provided in the upper coil assembly. The coil may be energized by means of leads 34 and 36, which in the preferred embodiment are connected to the coil circuit 38 installed in the upper coil support. When leads 34 and 36 are energized, coil circuit 39 is coupled to coil portion 38 through mutual inductance and resonates jointly therewith at substantially the same resonant frequency. Experiments with the coil depicted in FIG. 3a have shown that resonant frequency repeatability after removing and replacing upper coil assembly 56 is within 1 kHz. This is true even when an 8 mil. shim is placed between the upper and lower coil assemblies to simulate a slight coil misalignment. This is a variation in the resonant frequency of only about 0.6% of the bandwidth of a loaded coil which has a quality factor (Q) of approximately 80 and which resonates at 13 MHz. It has also been found that the resonant frequency of coil 39 installed in lower coil assembly 55, which typically remains attached to cradle 41, is 700 kHz higher than it is when the upper coil assembly is in place. This is advantageous in situations in which the coil depicted in FIG. 5 is utilized for NMR studies of the head, while a second body coil (not shown) in utilized to perform NMR studies of the torso. In this case, the lower head coil assembly can come closer to the body coil (as when examining the upper torso) than could a one-piece head coil of the type described with reference to FIG. 4 without there being any undesirable coupling between the head coil and body coil. It will be also recognized that, since upper coil assembly 56 is removable, the ease with which the patient is aligned within the RF coil is improved. In those situations where the patient must remain within the NMR apparatus for an extended period, as in the case of body studies, the upper coil assembly may be removed from about the head so as to improve patient comfort and lessen any feelings of claustrophobic confinement. In some embodiments, the lower coil assembly may be permanently installed on patient cradle 41.

Figure 2C:
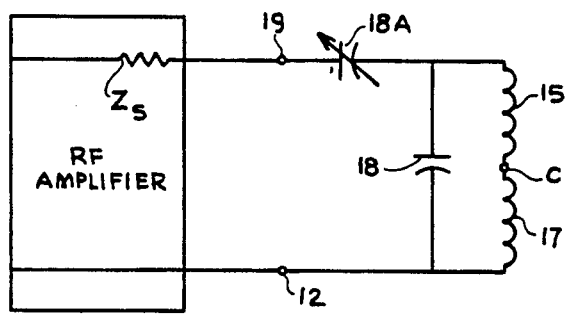

The two-piece coil assembly described above with reference to FIG. 5 may be also utilized and the advantages attendant thereto realized with coils which are not coupled by mutual inductance. An example so such a coil may be the two-turn, series-connected coil depicted in FIG. 2a and shown in circuit schematic form in FIG. 2c. In this case, coil turns 15 and 17 may be separated by creating an open circuit at point C. The separated coil turns would then be installed in the upper and lower coil assemblies. In use, serial electrical contact between the coil halves at point C could then be re-established by utilizing an electric jack-and-plug arrangement. For example, one of positioning pins 57A (FIG. 5) may comprise the plug connected to one coil turn, while a jack may be installed in a corresponding one of openings 57B so as to receive the plug.

Figure 6:
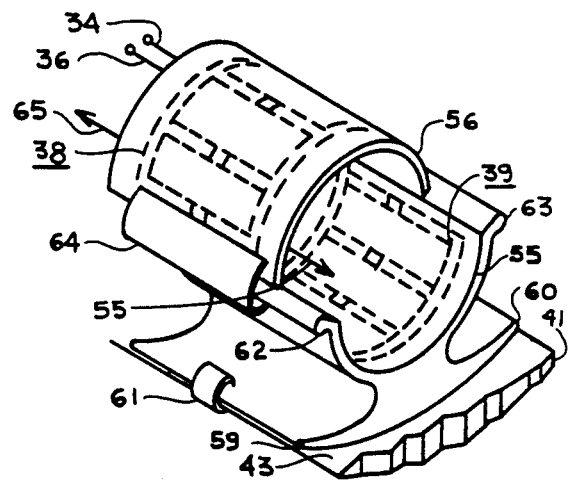
FIG. 6 depicts the preferred embodiment of the two-piece NMR RF coil constructed in accordance with the invention.

Another embodiment of the invention particularly useful in NMR studies of the head is depicted in FIG. 6. This embodiment is similar in some respects to that described with reference to FIG. 5 in that is also made up of like-numbered lower and upper coil assemblies 55 and 56 supporting RF coil circuits 39 and 38, respectively. Lower coil assembly 55 has a generally semi-cylindrical configuration for accommodating the head of the patient. A pair of longitudinal flanges 59 and 60 extend outwardly from the region of the assembly nearest the cradle and provide the means by which the assembly rests on the concave surface of cradle 41. A latch mechanism is provided in association with each of flanges 59 and 60 by which the lower coil assembly may be fastened to the cradle. An example of such a latch mechanism is that designated 61 and which is associated with flange 59. In this manner, lower coil assembly 55 is held firmly in place thereby avoiding undesired movement due to energization of magnetic-field-gradient coils (not shown) or to patient motion. It should also be noted that this configuration is able to support large weights without the structural limitation associated with the cantilevered head support 48 depicted in FIG. 4. The latch mechanisms also provide a ready means for removing and substituting coils. Upper coil assembly 56 is also configured as a semi-cylinder and is sized to have dimensions similar to those of lower coil assembly 55. In this manner, the upper and lower assemblies can be brought into contact along the longitudinal edges thereof so as to form a complete cylinder. Each of the longitudinal edges of the lower assembly are provided with flanges 62 and 63 which are slidably engaged by mechanical latches, such as latch 64 to hold upper assembly 56 in place while allowing relative longitudinal movement. In this manner, it is possible to slide the upper coil assembly relative to the lower in opposite directions as indicated by arrows 65 when it is necessary to position a patient in the lower assembly, or when it becomes necessary to adjust the patient's position during an examination. It is also possible by entirely releasing latches 64 to completely remove upper coil assembly 56.

Figure 7:
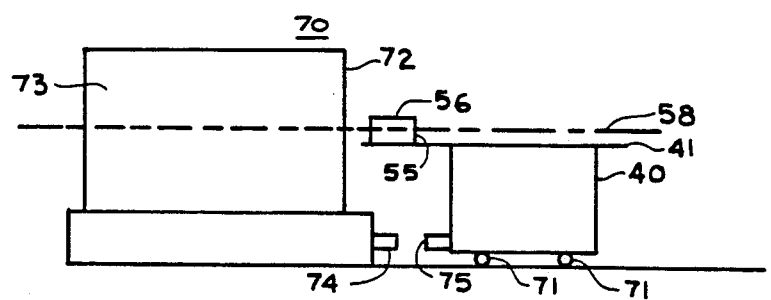
FIG. 7 depicts in simplified schematic form an NMR system including a patient support apparatus and illustrates the manner in which the invention RF coil is positioned on the patient support and transport system.

FIG. 7 illustrates in simplified schematic form an NMR system generally designated 70. The system is comprised of a magnet 72 having therein a longitudinal bore 73 for accepting in operation patient cradle 41. The inventive NMR RF coil comprised of coil assemblies 55 and 56 is positioned on the cradle (along with the patient, when in use) and is transported into the magnet bore by movement of the patient transport system 40 by means of wheels 71. During an examination, the patient transport 40 is held securely in place by means of a docking mechanism generally designated 74 and 75. It is in general desirable for the RF coil to be in coaxial alignment with the magnet bore along longitudinal axis 58.

In general, in accordance with the invention, the coil support assemblies, patient cradle, and related structures to be positioned with the magnet are constructed of non-NMR-active materials to avoid generation of spurious NMR signals. Typically, suitable materials are non-magnetic, non-metallic, non-hydroscopic, and non-RF absorptive. Materials for coil support assemblies must also have high dielectric properties. Examples of materials which may be used include polycarbonate resins (e.g., Lexan resin), thermoset resins (e.g., Noryl resin), and acrylic resins (e.g., Plexiglas resin). Lexan resin is preferred for its non-NMR-active properties and its high strength.

While this invention has been described with reference to particular embodiment and examples, other modifications and variations will occur to those skilled in the art in view of the above teachings. Accordingly, it should be understood that within the scope of the appended claims the invention may be practiced otherwise than is specifically described.

What is claimed is:

1. An NMR apparatus:
   means for producing a polarizing magnetic field;
   means for positioning in said polarizing magnetic field at least a part of an object to be examined; and
   RF coil means having first and second separable coil assemblies each supporting a separate coil circuit, said coil assemblies being joinable in operation to form therebetween an aperture for receiving said object portion, said coil circuits being coupled when said coil assemblies are joined and being capable of jointly functioning as a single resonant circuit when at least one of the coil circuits is energized:
   said coil circuits comprising tuned circuits and said coil assemblies each supporting one of said tuned circuits, which tuned circuits are capable of being coupled by mutual inductance.

2. The apparatus of claim 1 wherein said first and second coil assemblies comprise, respectively, upper and lower coil assemblies, said lower coil assembly having longitudinal flanges extending therefrom co-extensively with said means for positioning, said flanges forming a surface complementarily shaped to that of said means for positioning such that said lower assembly is firmly supported by said means for positioning.

3. The apparatus of claim 2 further comprising first latch means for engaging said longitudinal flanges and said means for positioning so as to releasably fasten thereto said lower coil assembly.

4. The apparatus of claim 3 further comprising second latch means for slidably securing said upper coil assembly to said lower coil assembly so as to permit relative longitudinal movement therebetween.

5. The apparatus of claim 4 wherein said lower coil assembly is provided with flanges at the parts thereof nearest said upper coil assembly, said last-mentioned flanges being engagable by said second latch means.

6. The apparatus of claim 1 wherein each of said coil assemblies is provided with electrical contact means connected to the coil circuit associated therewith, said contact means being capable of forming an electrically conductive connection between said coil circuits when said assemblies are joined.

7. The apparatus of claim 6 wherein said first and second coil assemblies comprise, respectively, upper and lower coil assemblies, said lower coil assembly having longitudinal flanges extending therefrom coextensively with said means for positioning, said flanges forming a surface complementarily shaped to that of said means for positioning such that said lower assembly is firmly supported by said means for positioning.

8. The apparatus of claim 7 further comprising first latch means for engaging said longitudinal flanges and said means for positioning so as to releasably fasten thereto said lower coil assembly.

9. The apparatus of claim 8 further comprising second latch means for slidably securing said upper coil assembly to said lower coil assembly so as to permit relative longitudinal movement therebetween.

10. The apparatus of claim 9 wherein said lower coil assembly is provided with flanges at the parts thereof nearest said upper coil assembly, said last-mentioned flanges being engagable by said second latch means.

11. The apparatus of claim 1 wherein said lower coil assembly is affixed to and forms part of said means for positioning.

12. An NMR apparatus comprising:
means for producing a polarizing magnetic field;
means for positioning in said polarizing magnetic field at least a portion of an object to be examined;
RF coil means having first and second separable assemblies, each supporting a separate coil circuit, said first assembly being fastenable to said means for positioning, said second assembly being, in operation, slidably fastenable to said first assembly to form jointly therewith said RF coil means having an aperture therein for receiving said object portion, said first and second parts being coupled to operate jointly as a single resonant circuit when one of said coil circuits is energized, said coil circuits comprising tuned circuits and each of said coil assemblies supporting one of said tuned circuits, which tuned circuits are capable of being coupled by mutual inductance.

13. The apparatus of claim 12 wherein said first and second coil assemblies comprise, respectively, upper and lower coil assemblies, said lower coil assembly having longitudinal flanges extending therefrom coextensively with said means for positioning, said flanges forming a surface complementarily shaped to that of said means for positioning such that said lower assembly is firmly supported by said means for positioning.

14. The apparatus for claim 13 further comprising first latch means for engaging said longitudinal flanges and said means for positioning so as to releasably fasten thereto said lower coil assembly.

15. The apparatus of claim 14 further comprising second latch means for slidably securing said upper coil assembly to said lower assembly so as to permit relative longitudinal movement therebetween.

16. The apparatus of claim 15 wherein said lower coil assembly is provided with flanges at the parts thereof nearest said upper coil assembly, said last-mentioned flanges being engagable by said second latch means.

17. The apparatus of claim 12 wherein each of said coil assemblies is provided with electrical contact means connected to the coil circuit associated therewith, said contact means being capable of forming an electrically conductive connection between said coil circuits when said assemblies are joined.

18. The apparatus of claim 12 wherein said lower coil assembly is affixed to and forms part of said means for positioning.

19. An NMR RF coil comprising first and second separable coil assemblies each supporting a separate coil circuit, said coil assemblies being joinable in operation to form therebetween an aperture for receiving a portion of an object to be studied, said coil circuits being coupled when said coil assemblies are joined and being circuits is energized, said coil circuits comprising tuned circuits and each of said coil assemblies supporting one of said tuned circuits, which tuned circuits are capable of being coupled by mutual inductance.

20. The RF coil of claim 19 wherein said first and second coil assemblies comprise, respectively, upper and lower coil assemblies, said lower coil assembly having longitudinal flanges extending thereform.

21. The RF coil of claim 20 further comprising first latch means for engaging said longitudinal flanges.

22. The RF coil of claim 21 further comprising second latch means for slidably securing said upper coil assembly to said lower coil assembly so as to permit relative longitudinal movement therebetween.

23. The RF coil of claim 22 wherein said lower coil assembly is provided with flanges at the parts thereof nearest said upper coil assembly, said last-mentioned flanges being engagable by said second latch means.

24. The RF coil of claim 19 wherein each of said coil assemblies is provided with electrical contact means connected to the coil circuit associated therewith, said contact means being capable of forming an electrically conductive connection between said coil circuits when said assemblies are joined.

25. The RF coil of claim 24 wherein said first and second coil assemblies comprise, respectively, upper and lower coil assemblies, said lower coil assembly having longitudinal flanges extending thereform.

26. The RF coil of claim 25 further comprising first latch means for engaging said longitudinal flanges and said means for positioning so as to releasably fasten thereto said lower coil assembly.

27. The RF coil of claim 26 further comprising second latch means for slidably securing said upper coil assembly to said lower coil assembly so as to permit relative longitudinal movement therebetween.

28. The RF coil of claim 27 wherein said lower coil assembly is provided with flanges at the parts thereof nearest said upper coil assembly, said last-mentioned flanges being engagable by said second latch means.

29. The RF coil of claim 19 wherein said lower coil assembly is affixed to and forms part of said means for positioning.

* * * * *